(12) United States Patent
Van Lammeren et al.

(10) Patent No.: US 7,683,721 B2
(45) Date of Patent: Mar. 23, 2010

(54) PLL CIRCUIT

(75) Inventors: Johannes Petrus Maria Van Lammeren, Nijmegen (NL); Jozef Jacobus Agnes Maria Verlinden, Eindhoven (NL); Edwin Jan Schapendonk, Nijmegen (NL)

(73) Assignee: NXP B.V., Eindhoven (NL)

( * ) Notice: Subject to any disclaimer, the term of this patent is extended or adjusted under 35 U.S.C. 154(b) by 924 days.

(21) Appl. No.: 10/585,779

(22) PCT Filed: Dec. 29, 2004

(86) PCT No.: PCT/IB2004/052931

§ 371 (c)(1), (2), (4) Date: Jul. 11, 2006

(87) PCT Pub. No.: WO2005/069489

PCT Pub. Date: Jul. 28, 2005

(65) Prior Publication Data

US 2009/0189698 A1    Jul. 30, 2009

(30) Foreign Application Priority Data

Jan. 12, 2004   (EP) .................................. 04100072

(51) Int. Cl.
*H03L 7/00* (2006.01)

(52) U.S. Cl. ........................ 331/16; 331/34; 331/177 R; 331/1 A

(58) Field of Classification Search .................... 331/16, 331/17, 34, 177 R
See application file for complete search history.

(56) References Cited

U.S. PATENT DOCUMENTS 5,208,555 A     5/1993   Graham
5,694,087 A    12/1997   Ferraiolo et al.
7,095,287 B2 *  8/2006   Maxim et al. .................. 331/44

* cited by examiner

*Primary Examiner*—Arnold Kinkead

(57) ABSTRACT

The present invention relates to a phase locked loop arrangement having an oscillator circuit (240) controlled in response to an output signal of a phase or frequency detection circuit (210), wherein change control (130) are provided for generating a blocking signal in response to the outputs of a first timer (110) to which a predetermined threshold frequency is supplied and a second timer (112) to which an output frequency of the oscillator circuit (240) is supplied. Based on the blocking signal, blocking (260) suppress supply of the output signal to said oscillator circuit (240). Thereby, the output frequency of the PLL arrangement can be prevented from changing beyond the frequency threshold, while only one PLL circuit is required.

13 Claims, 3 Drawing Sheets

PLL CIRCUIT

Present invention relates to phase-locked loop (PLL) arrangement having an oscillator circuit controlled in response to an output signal of a phase or frequency detection circuit.

In television integrated circuits (ICs), many digital circuits need a clock that is a multiple of the line frequency. Such a clock is usually called a Line-Locked Clock (LLC). Normally, a PLL circuit is used as the required frequency multiplier. However, if the line frequency is disturbed due to, for example, power dips or the like, the output frequency of the PLL may at least temporarily jump or change to such a high value that the circuits which are clocked with this frequency are driven beyond their timing constraints. This will make the operation of the driven circuits unreliable.

Presently, this problem is solved by locking a reference PLL to a crystal oscillator. The PLL is then matched to the reference PLL and receives the input signal. Due to the matching with the reference oscillator, the free-running frequency of the PLL is accurately known and its control range can be limited to a fraction of what is necessary if the free-running frequency is not controlled. However, a main advantage of this system is that it needs two PLLs. These are relatively large analogue circuits, such that a solution with only one PLL would be preferable.

Document U.S. Pat. No. 5,208,555 describes a limiting circuit in which the frequency at the output of a voltage controlled oscillator (VCO) of a PLL is detected. If this output frequency is above a certain value, the limiting circuit forces the output frequency of the VCO to decrease until it is below this certain value. This acts to keep the output frequency of the VCO below a selected frequency, which can be accurately processed by the feedback circuits driven by the VCO. Once the output frequency of the VCO is below the certain value, the limiting circuit stops forcing the output frequency to decrease, and the limiting circuit becomes transparent. At this point, the conventional feedback circuitry driving the VCO takes over the adjustment of the VCO output frequency. In particular, an analogue voltage, which is generated from the PLL's output signal is compared to another analogue voltage. However, process spread, supply variation and temperature variations lead to reduced accuracy of the selected maximum frequency. Moreover, such a forced decrease of the output frequency may lead to a continuous change of the output frequency near the selected frequency and thus increase undesired jitter components. Due to the fact that the comparison is continuously performed, the frequency will continuously change at a relatively high rate causing continuous high-rate jitter.

It is therefore an object of the present invention to provide an improved PLL arrangement.

This object is achieved by a PLL arrangement as claimed in claim 1. Accordingly, the respective control signal supplied to the controlled oscillator circuit is blocked in response to the blocking signal which can be generated when the outputs of the first and second timer means indicate that the threshold frequency has been reached by the output frequency of the oscillator circuit. The time period of the first and second timer means can be selected to obtain an adequate detection period. Due to the fact that the supply of the output signal of the phase or frequency detection circuit is suppressed or blocked in response to the blocking signal, the output frequency is kept stable at the maximum frequency until the frequency of input signal is reduced again below the threshold frequency. A continuous frequency variation around the threshold frequency can thus be prevented. Due to the blocking operation, the PLL frequency cannot reach too high frequency values. Hence, the proposed system can be called a pro-active system while the above known system is a reactive system. Furthermore, the proposed solution requires only one PLL and a simple guarding circuitry, which may easily be integrated.

The threshold frequency may be generated by a reference oscillator means. Thereby, a reliable reference frequency or threshold frequency can be generated.

Furthermore, the first and second timer means each may comprise a counter circuit, wherein the threshold frequency and the output frequency are supplied to respective clock inputs of the counter circuits. This provides the advantage that the counter circuits may be set to a predetermined maximum count value and the change control means may be controlled based on carry signals generated by the counter means when the maximum or minimum count value has been reached.

The change control means may comprise a finite state machine to which respective carry signals of the first and second timer means are supplied and which is configured to generate the blocking signal and a reset signal for resetting the first and second timer means in response to at least one of the carry signals. In particular, the finite state machine may comprise a logic circuit adapted to generate a logic signal from which the blocking signal is derived, wherein the logic signal is active when both carry signals are active, or when the reset signal and the blocking signal are active, or when the reset signal is not active and the blocking signal is active. Thus, the state after the last comparison or detection can be considered during actual control. The blocking signal and the reset signal can be latched by respective flip-flop circuits to which the output frequency is supplied as a clock signal.

The blocking means may comprise controllable switching means for switching a connection between the detection circuit and the oscillator circuit. Thereby, a simple implementation can be provided by simply connecting a switch or switching element between the output of the phase or frequency detection circuit and the next circuit in the chain towards the controlled oscillator circuit.

According to a first aspect of the present invention, the threshold frequency may be an upper threshold frequency and the output signal may be used to increase the output frequency of the oscillator circuit. Alternatively or additionally, according to a second aspect of the present invention, the threshold frequency may be a lower threshold frequency and the output signal may be used to decrease the output frequency of the oscillator circuit. Thus, an upper and/or lower frequency limit can be set in order to keep the PLL arrangement between at least one of these frequency limits or thresholds.

Further advantageous modifications are defined in the dependent claims.

In the following, the present invention will be described in greater detail based on predetermined embodiments with reference to the accompanying drawings in which.

Figure 1:
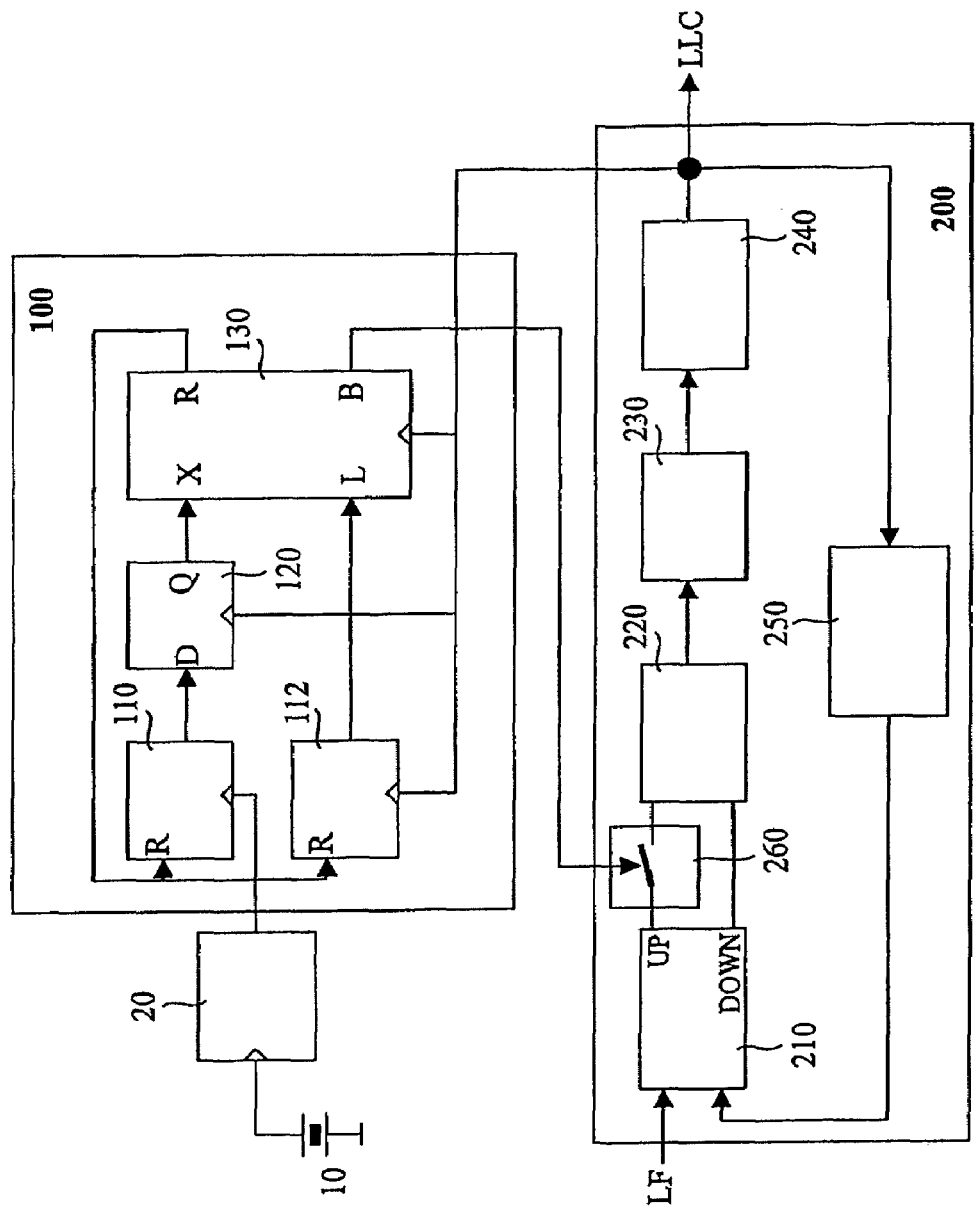
FIG. 1 shows a schematic block diagram of a frequency-limited PLL circuit according to a first preferred embodiment.

The first preferred embodiment will now be described based on a PLL arrangement with an upper frequency limitation as shown in FIG. 1. According to FIG. 1 the PLL arrangement comprises a PLL circuit 200 and a guard circuit 100, which generates a control signal for blocking a possible increase of the PLL output frequency, if the output frequency has reached a predetermined upper threshold value.

The PLL circuit 200 comprises a phase and frequency detector 210 to which an input signal, which may be a line frequency LF, is supplied. The detector 210 generates a DOWN output if the frequency of a feedback signal generated from the output frequency, e.g. LLC, by a frequency division at a frequency division circuit 250 is greater than the frequency of the input signal. This causes a pump circuit 220 to supply a current to its output line so as to charge or discharge a filter circuit 230 and thus rise or lower the voltage at a control terminal of a VCO 240 to lower the output frequency of the VCO 240. Accordingly, this resulting decrease in the output frequency will cause the divided feedback frequency to decrease until it is equal to the frequency of the input signal. At this point, the detector 210 will stop supplying an output signal to the charge pump circuit 220. Therefore, the PLL circuit 200 will operate in such a manner as to make the divided feedback frequency track the frequency and phase of the input signal.

In similar manner, an UP output will be supplied to the charge pump circuit 220 if the divided feedback frequency supplied from the frequency division circuit 250 is smaller than the frequency of the input signal, to thereby increase the output frequency and the divided feedback frequency until the feedback frequency and the input frequency are matched again.

According to the first preferred embodiment, the guard circuit 100 will prevent the PLL circuit 200 from generating a too high frequency. Assuming a division rate N of the frequency division circuit 250, the output frequency is N times the input frequency as the feedback path divides the output frequency by N. In particular, the output frequency is prevented from increasing beyond a predetermined threshold frequency by having the guard circuit 100 continuously measure the output frequency of the PLL circuit 200. If the output frequency reaches the preset threshold frequency or limit, the UP output of the detector 210 is blocked by a switching circuit 260. This means that the PLL circuit 200 can now only be controlled by the DOWN output to a lower output frequency.

The output frequency of the PLL circuit 200 is measured by counting the number of clock cycles within a reference time set in a counter circuit 112. An additional reference counter circuit 110 is provided in the guard circuit 100 to which the output signal of a crystal oscillator 20 having a frequency-determining crystal element 10 is supplied. A reference time is generated by counting clock pulses received from the crystal oscillator 20 in the reference counter 110. As an alternative, another sufficiently accurate timing source could be used instead of the crystal oscillator 20.

If the number of clock cycles counted at the counter 112 exceeds a certain number during the reference time, the output frequency is judged too high. As the crystal oscillator 20 and the PLL circuit 200 are free-running with respect to each other, the number of PLL clock pulses, which is counted during the reference time will vary even if the respective frequency does not change. The ideal ratio would be $M_X/M_L$, wherein $M_X$ indicates the number of clock pulses counted at the reference counter 110 and $M_L$ indicates the number of clock pulses counted at the counter 112. In practice, the number of counted clock cycles will vary between $M_X/M_L$ and $M_X/(M_L-2)$. This is caused by the arbitrary phase shift occurring between the free-running circuits.

The counter 112 and the reference counter 110 of the guard circuit 100 each generate a carry output once they reach a preset value. Both carry outputs are sent to a finite state machine (FSM) 130. The reference carry output of the reference counter 110 is sent through a synchronizing flip-flop circuit 120, which is clocked by the output frequency of the PLL circuit 200. The FSM 130 outputs a reset signal R to reset the counter 112 and the reference counter 110, and a blocking signal B which controls the switching element 260 to block the UP output of the detector 210 if the frequency was determined to be too high, i.e. if the output frequency of the PLL circuit 200 has reached the predetermined upper threshold value. The reference counter 110 may have a synchronous reset input R to prevent problems due to the fact that its reset signal is generated in another clock region.

Figure 2:
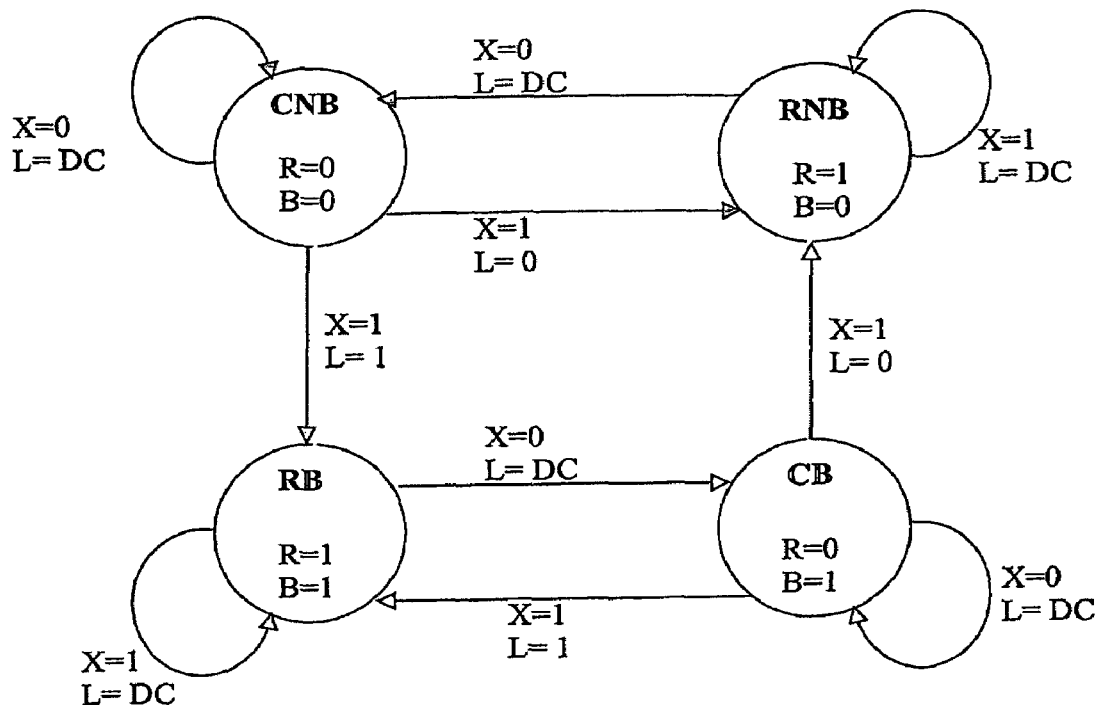
FIG. 2 shows a state diagram of a finite state machine provided in the PLL circuit according to the preferred embodiments.

FIG. 2 shows a state diagram of the FSM 130. According to this state diagram, the FSM 130 can be set to four different output states depending on the value of the carry signals X and L, and on the last values of the output signals R and B. During a non-blocked operation of the PLL circuit 200, the FSM 130 is in the upper left non-blocked counting state NBC where both output signals R and B are at low logical level, i.e. "0", or non-active state and a counting operation of the two counters 110, 112 is performed. As long as the reference carry signal X is "0", the FSM 130 remains at this state. If the reference carry signal X and also the carry signal L are changed to high logical level, i.e. "1", or active state substantially at the same time, the FSM 130 changes to a blocked reset state BR, where both output signals R and B are set to "1", i.e. the counters 110, 112 are reset and the blocking signal B is generated or set into the active state. The FSM 130 will remain in this state as long as the reference carry signal X is "1". When the reference carry signal X changes to "0", the FSM 130 changes to a blocked counting state BC, where the reset output signal R is changed to "0" and the blocking output signal remains at "1". This state is maintained as long as the reference carry signal X stays at "0". When the reference carry signal X changes to "1" and the other carry signal L is "0", the FSM 130 changes to a non-blocked reset state NBR, where the reset output signal R is set to "1" and the blocking output signal B is set to "0", such that the blocking state is released. This state will remain as long as the reference carry signal X stays at "1". When the reference carry signal X changes to "0", the FSM 130 changes back to the initial non-blocked counting state NBC. From this state, the FSM 130 changes back to the non-blocking reset state NBR if the reference carry signal X changes to "1", while the other carry signal L is "0".

Hence, during a normal operation of the PLL circuit 200, the FSM 130 is in an non-blocking mode where it continuously changes between the non-blocked counting state NBC and the non-blocked reset state NBR. When the frequency threshold has been reached, both carry signals X and L are set to "1" substantially at the same time, and the FSM 130 changes to a blocking mode where it continuously changes between the blocked reset state BR and the blocked counting state BC as long as the output frequency of the PLL circuit 200 prevails beyond the frequency threshold. When the frequency threshold is no longer reached, the FSM 130 changes back to the non-blocked states NBC and NBR.

Figure 3:
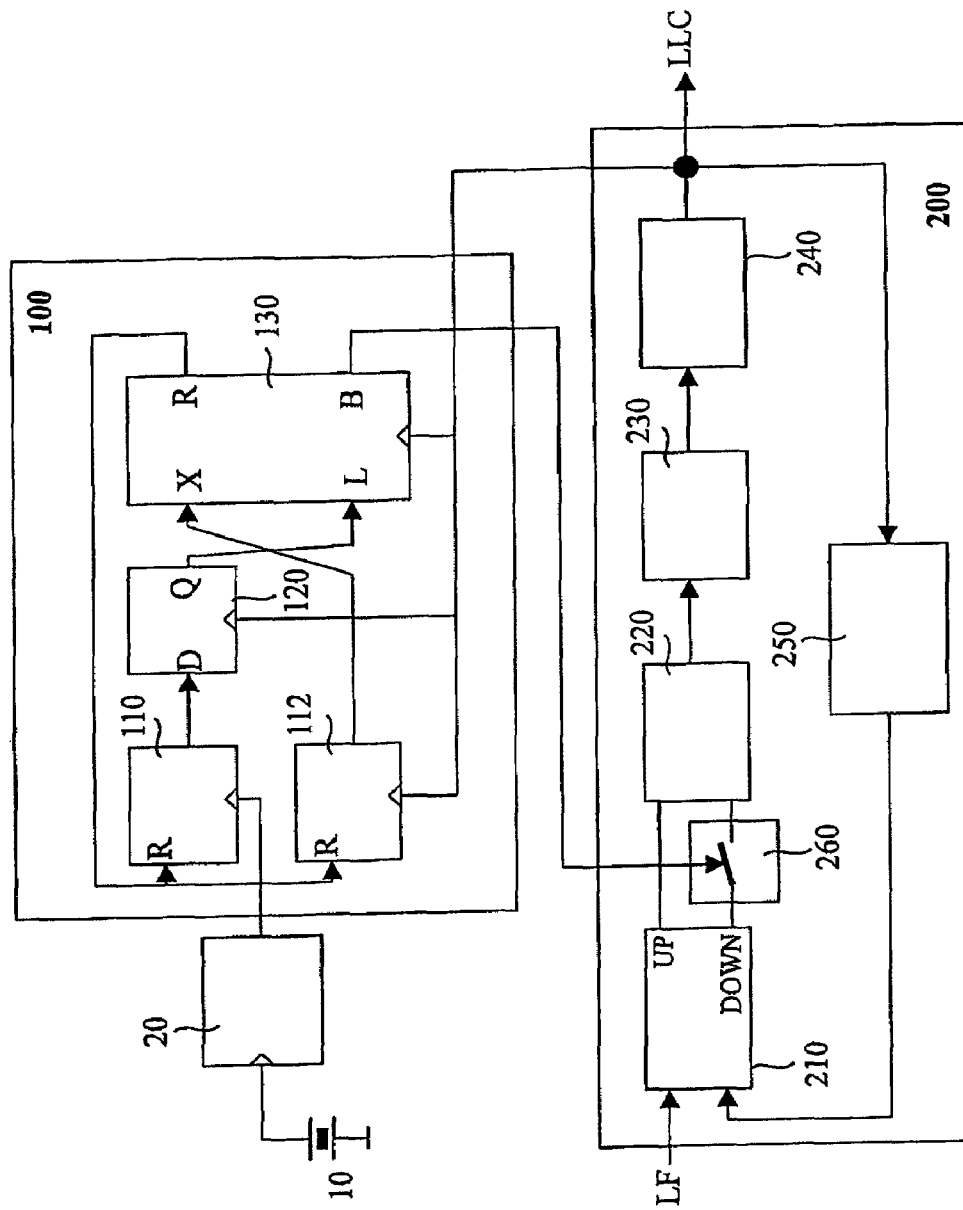
FIG. 3 shows a frequency-limited PLL circuit according to a second preferred embodiment.

FIG. 3 shows a PLL arrangement according to the second preferred embodiment, which differs from the first embodiment in that now the output frequency of the PLL circuit 200 is limited to a lower threshold frequency. This is achieved simply by changing the input signals of the FSM 130 and by providing the switching element 260 at the DOWN output of the detection circuit 210. Thereby, the PLL arrangement can be adapted to prevent the frequency from becoming too low, i.e. from falling below the threshold frequency defined by the reference counter 110. The operation of the FSM 130 remains the same. If these two options are combined, it is even possible to keep the output frequency of the PLL circuit 200 within a predefined frequency window.

Figure 4:
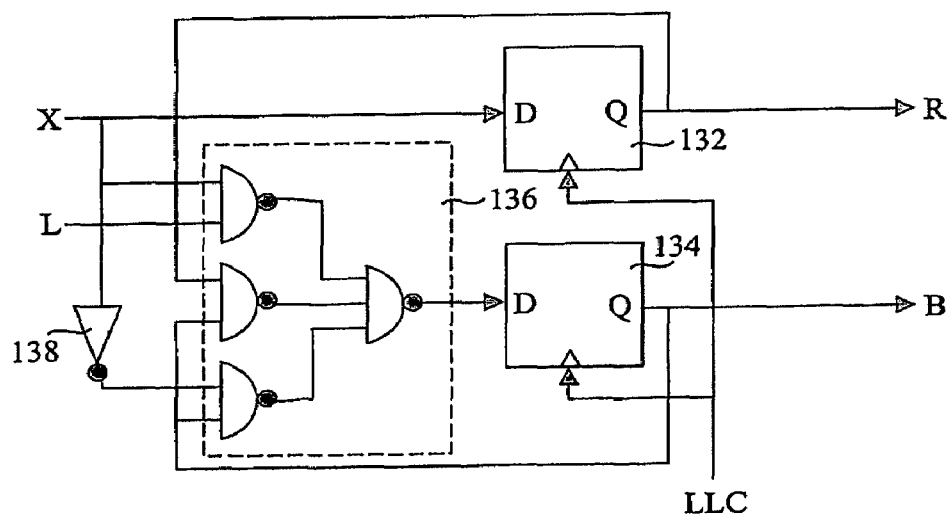
FIG. 4 shows an example for an implementation of the finite state machine provided in the PLL circuit according to the preferred embodiments.

FIG. 4 shows an example of an implementation of the FSM 130. According to FIG. 4, a logic circuit 136 is provided to which the reference carry signal X and the other carry signal L are supplied together with the reset output signal R and the blocking output signal B of the FSM 130. The reference carry X of the reference counter 110 is directly supplied to a first flip-flop circuit or latch circuit 132, which generates the reset output signal R. The output of the logic circuit 136 is supplied to a second flip-flop circuit or latch circuit 134, which generates the blocking output signal B. Both flip-flop circuits 132, 134 are clocked by the output frequency of the PLL circuit 200. The output signal A of the logic circuit 136, which defines the blocking output signal B after the next clock can be described by the following equation in Boolean logic equation:

$$A = XL \vee RB \vee \overline{X}B,$$

where "v" indicates the operator for the logical OR operation, and a missing operator between two binary variables indicates the logical AND operation.

Hence, the logic circuit 136 generates a high level output or an active output if both carry signals X and L are set at the high level "1", or if both output signals R and B are at a high level "1", or if the reference carry signal X is at a low level "0" and the blocking output signal B is at a high level "1". This means that an active blocking output signal B="1" is generated, when the output frequency of the PLL circuit 200 has reached the threshold frequency, and the active blocking output signal is maintained until the reference counter 110 has set its reference carry signal X into the active state earlier than the other counter 112. Of course, the logic circuit 136 can be replaced by any other logic circuit satisfying the above logic equation.

It is noted that the present invention is not restricted to the above-preferred embodiments. Any kind of switching, blocking or suppressing element can be used to prevent the output or generation of the respective output signal of the detection circuit. Furthermore, any other timer circuit suitable to generate output signals corresponding to the respective frequencies can replace the counter circuits 110, 112. Additionally, the FSM 130 can be replaced by any control circuit, which generates a suitable blocking signal in response to the outputs of the timer circuits. The preferred embodiments may thus vary within the scope of the attached claims.

The invention claimed is:

1. A phase locked loop circuit arrangement comprising an oscillator circuit controlled in response by a signal of a phase or frequency detection circuit, phase locked loop circuit further comprising:
   first timer circuitry for receiving a predetermined threshold frequency;
   second timer circuitry for receiving an output frequency of said oscillator circuit, the first and second timing circuitries providing an output signal to indicate the status of the output frequency relative to the predetermined threshold frequency;
   change control circuitry for generating a blocking signal in response to the outputs of said first and second timer circuitries, and
   blocking circuitry for suppressing supply of said output signal towards said oscillator circuit in response to said blocking signal to stabilize the output frequency.

2. An arrangement according to claim 1, further comprising a reference oscillator circuit for generating said threshold frequency.

3. An arrangement according to claim 1, wherein each of said first and second timer circuitries comprise a counter circuit and wherein said threshold frequency and said output frequency are supplied to respective clock inputs of said counter circuits.

4. An arrangement according to claim 1, wherein said change control circuitry comprises a finite state machine for receiving respective carry signals of said first and second timer circuitries, the finite state machine being configured to generate said blocking signal and a reset signal for resetting said first and second timer circuitries in response to at least one of said carry signals.

5. An arrangement according to claim 4, wherein said finite state machine comprises a logic circuit adapted to generate a logic signal from which said blocking signal is derived, and wherein said logic signal is active when both carry signals are active, or when said reset signal and said blocking signal are active, or when said reset signal is not active and said blocking signal is active.

6. An arrangement according to claim 4, wherein said finite state machine has a first state during which said first and second timer circuitries are operated and said blocking signal is not active, a second state during which said reset signal is active to reset said first and second timer circuitries and said blocking signal is not active, a third state during which said first and second timer are operated and said blocking signal is active, and a fourth state during which said reset signal is active to reset said first and second timer circuitries and said blocking signal is active.

7. An arrangement according to claim 4, wherein said blocking signal and said reset signal are latched by respective flip-flop circuits to which said output frequency is supplied as a clock signal.

8. An arrangement according to claim 1, wherein said blocking comprises controllable switching circuit configured for switching a connection between said detection circuit and said oscillator circuit.

9. An arrangement according to claim 1, wherein said threshold frequency is an upper threshold frequency and said output signal is used to increase said output frequency of said oscillator circuit.

10. An arrangement according to claim 1, wherein said threshold frequency is a lower threshold frequency and said output signal is used to decrease said output frequency of said oscillator circuit.

11. A phase locked loop circuit arrangement comprising:
   a phase or frequency detection circuit providing a first signal;
   an oscillator circuit controlled in response to the first signal;
   a timing circuit configured to receive a predetermined threshold frequency and to receive an output frequency of the oscillator circuit and, in response thereto, provide a timing circuit output;
   a change control circuit configured to generate a blocking signal in response to the output of the timing circuit; and
   a blocking circuit configured to suppress supply of the timing circuit output towards the oscillator circuit in response to the blocking signal and, thereby, stabilize the output frequency of the oscillator circuit.

12. The phase locked loop circuit arrangement of claim 11, wherein the timing circuit is further configured to indicate the status of the output frequency relative to the predetermined threshold frequency.

13. The phase locked loop circuit arrangement of claim 11, wherein the change control circuit includes a finite state machine for responding to the timing circuit, the finite state machine being configured to generate the blocking signal and a reset signal for resetting the timing circuit in response thereto.

* * * * *